(12) United States Patent
Wolpert et al.

(10) Patent No.: US 11,830,778 B2
(45) Date of Patent: Nov. 28, 2023

(54) BACK-SIDE WAFER MODIFICATION

(71) Applicant: International Business Machines Corporation, Armonk, NY (US)

(72) Inventors: David Wolpert, Poughkeepsie, NY (US); Daniel James Dechene, Watervliet, NY (US); Lawrence A. Clevenger, Saratoga Springs, NY (US); Michael Romain, Beacon, NY (US); Somnath Ghosh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 135 days.

(21) Appl. No.: 17/095,931

(22) Filed: Nov. 12, 2020

(65) Prior Publication Data

US 2022/0148927 A1   May 12, 2022

(51) Int. Cl.
*H01L 21/66* (2006.01)
*H01L 23/14* (2006.01)
(Continued)

(52) U.S. Cl.
CPC ........ *H01L 22/20* (2013.01); *H01L 21/67248* (2013.01); *H01L 21/67288* (2013.01); *H01L 23/13* (2013.01); *H01L 23/14* (2013.01)

(58) Field of Classification Search
CPC .............. H01L 22/20; H01L 21/67248; H01L 21/67288; H01L 23/13; H01L 23/14; H01L 22/12
See application file for complete search history.

(56) References Cited

U.S. PATENT DOCUMENTS

| 8,183,578 B2 * | 5/2012 | Wang ...................... H01L 33/58 |
| | | 257/E33.001 |
| 8,222,118 B2 | 7/2012 | Dydyk et al. |
| | | (Continued) |

FOREIGN PATENT DOCUMENTS

| CN | 106257254 A | 12/2016 |
| WO | 0124240 A1 | 4/2001 |
| WO | 2004053993 A1 | 6/2004 |

OTHER PUBLICATIONS

Pang et al., "Characterization and Management of Wafer Stress for Various Pattern Densities in 3D Integration Technology", 2010 Electronic Components and Technology Conference, pp. 1866-1869.

(Continued)

*Primary Examiner* — Mohammed Shamsuzzaman
(74) *Attorney, Agent, or Firm* — Eric W. Chesley (57) ABSTRACT

A method can include obtaining characteristic data for a wafer. The characteristic data can correspond to the wafer in a processed state and can include a set of stress values of the wafer. The wafer can include a front side, a back side opposite the front side, and a set of regions. The set of stress values can include a first stress value corresponding to a first region. In the processed state, one or more front-side processes can be completed on the front side of the wafer. The method can include determining that the first stress value exceeds a stress threshold and generating a compensation map. The compensation map can identify one or more regions for forming one or more trenches. The method can include initiating, based on the compensation map, a formation of a first trench on the back side of the wafer in the first region.

10 Claims, 8 Drawing Sheets

(51) Int. Cl.
*H01L 21/67* (2006.01)
*H01L 23/13* (2006.01)

(56) References Cited

U.S. PATENT DOCUMENTS

| | | | |
|---|---|---|---|
| 8,476,150 B2 | 7/2013 | Jerome et al. | |
| 8,956,960 B2* | 2/2015 | Irsigler | H01L 21/76224 |
| | | | 117/9 |
| 9,646,938 B2* | 5/2017 | Chen | H01L 21/3205 |
| 9,881,788 B2 | 1/2018 | Kim et al. | |
| 10,157,747 B2 | 12/2018 | deVilliers | |
| 10,614,190 B2 | 4/2020 | Chidambarrao et al. | |
| 10,692,839 B2 | 6/2020 | Dasgupta | |
| 10,797,681 B1* | 10/2020 | Hurwitz | H01L 21/76871 |
| 2006/0051916 A1* | 3/2006 | Chung | H01L 27/1087 |
| | | | 257/E21.396 |
| 2010/0200949 A1* | 8/2010 | Booth, Jr. | H01L 29/945 |
| | | | 257/532 |
| 2012/0210283 A1 | 8/2012 | Li | |
| 2014/0232433 A1 | 8/2014 | Von Kluge | |
| 2014/0374879 A1* | 12/2014 | Chen | H01L 28/40 |
| | | | 257/532 |
| 2015/0318319 A1* | 11/2015 | Peng | H01L 27/14643 |
| | | | 257/292 |
| 2015/0364362 A1* | 12/2015 | Engbrecht | H01L 21/3081 |
| | | | 438/697 |
| 2017/0330789 A1* | 11/2017 | Kar-Roy | H01L 23/481 |
| 2018/0336491 A1 | 11/2018 | Altevogt et al. | |
| 2019/0131478 A1* | 5/2019 | Wang | H01L 27/14689 |
| 2020/0251510 A1* | 8/2020 | Ge | H01L 27/14621 |
| 2022/0122880 A1* | 4/2022 | Chen | H01L 21/76224 |
| 2022/0130725 A1* | 4/2022 | Lee | H01L 21/76832 |

OTHER PUBLICATIONS

"Patent Cooperation Treaty PCT Notification of Transmittal of the International Search Report and the Written Opinion of the International Searching Authority, or the Declration", Applicant's file reference PF210827PCT, International Application No. PCT/CN2021/127952, International filing date, Nov. 21, 2021, dated Jan. 30, 2022.

UK Examination Report for Application GB2307330.7, dated Jul. 19, 2023, 4 pages.

* cited by examiner

BACK-SIDE WAFER MODIFICATION

BACKGROUND

The present disclosure relates to wafer fabrication, and more specifically, to back-side wafer modification.

Wafer fabrication can include performing a series of processing steps on a wafer, such as a silicon wafer, to generate a set of dies that can each include at least one electronic circuit. The processing steps can include operations performed on a front side of the wafer and on a back side of the wafer.

SUMMARY

According to embodiments of the present disclosure, a method can include obtaining characteristic data for a wafer. The characteristic data can correspond to the wafer in a processed state. The characteristic data can include a set of stress values of the wafer in the processed state. The wafer can include a front side, a back side opposite the front side, and a set of regions. The set of stress values can include a first stress value. The first stress value can correspond to a first region of the set of regions. In the processed state, one or more front-side processes can be completed on the front side of the wafer. The method can include determining that the first stress value exceeds a stress threshold. The method can include generating, in response to the determining, and based on the characteristic data, a compensation map. The compensation map can identify one or more regions of the set of regions for forming one or more trenches. The method can include initiating, based on the compensation map, a formation of a first trench on the back side of the wafer in the first region.

Embodiments of the present disclosure can be illustrated as a device having a wafer. The wafer can have a front side and a back side. The front side can be configured to receive front-side processing features. The front-side processing features can form one or more electronic circuits. The back side can be opposite the front side. The back side can include a back-side surface and a first set of trenches. The first set of trenches can include a first trench and a second trench. The first trench can be substantially parallel to the second trench. The first trench and the second trench can extend substantially perpendicularly from the back-side surface toward the front side.

Embodiments of the present disclosure can be illustrated as a device having a wafer. The wafer can have a front side and a back side opposite the front side. The front side can include front-side processing features. The front-side processing features can form one or more electronic circuits. The front-side processing features can include a first set of deep trenches and a second set of deep trenches. A gap can be disposed between the first set of deep trenches and the second set of deep trenches. The gap can have no deep trenches present in the gap. The back side can include a back-side surface and a first set of trenches. The first set of trenches can include a first trench and a second trench. The first trench can be substantially parallel to the second trench. The first trench and the second trench can extend substantially perpendicularly from the back-side surface toward the front side. The first set of trenches can be disposed beneath the gap and between the first set of deep trenches and the second set of deep trenches.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to wafer fabrication; more particular aspects relate to back-side wafer modification. While the present disclosure is not necessarily limited to such applications, various aspects of the disclosure may be appreciated through a discussion of various examples using this context.

Wafer fabrication can include performing a series of processing steps on a wafer, such as a silicon wafer, to generate a set of dies that can each include at least one electronic circuit. The processing steps can include operations performed on a front side of the wafer and on a back side of the wafer. For example, in some instances, front-side processing steps can include etching processes and deposition processes to form features, such as circuit layers, conductive traces, and transistors, on a front side of the wafer. In some instances, back-side processing steps can include grinding to modify a thickness of the wafer and polishing and/or applying materials to repair wafer damage caused by such grinding. In some instances, one or more of the front-side operations can induce stresses within the wafer. Such stresses can cause the wafer to bow such that one or more regions of the wafer deviate from a threshold flatness.

Bowing of the wafer can contribute to a variety of problems with subsequent front-side processing operations. For example, a front-side processing operation can include deep-trench etching (e.g., an etching process to form a front-side trench that extends beyond a buried insulator layer in a silicon-on-insulator process). In some instances, such deep-trench etching can induce stresses that cause one or more regions of the wafer to bow. The unevenness of the wafer caused by the wafer bowing can introduce undesired variations in the wafer. For example, in some cases, a pattern of straight lines to be transferred to the wafer can be formed as curved lines on the wafer, due to wafer unevenness. In another example, such unevenness can result in a planarization process removing more material in some regions of the wafer than in others. Accordingly, bowing of the wafer can contribute to die defects.

To address these and other challenges, embodiments of the present disclosure include a wafer modification system. In some embodiments, the wafer modification system can predict whether stresses induced by front-side processing operations may cause wafer bowing. In response to a prediction that wafer bowing may occur, the wafer modification system can initiate a formation of one or more back-side trenches to reduce such predicted bowing. Particularly, the wafer modification system can generate, based on characteristic data for a wafer, a compensation map. The compensation map can identify one or more regions of the wafer in which forming a set of back-side trenches can compensate for stresses that may contribute to wafer bowing. Based on the compensation map, the wafer modification system can initiate the formation of the set of back-side trenches. In some embodiments, the formation of the set of back-side trenches can occur before the wafer is in a processed state (e.g., before one or more front-side processes are completed on the front side of the wafer).

By generating a compensation map, embodiments of the present disclosure can reduce wafer bowing in an efficient manner that is tailored to the characteristics of a particular wafer being processed. For example, embodiments of the present disclosure can initiate the formation of back-side trenches in the specific instances in which wafer bowing is predicted to occur and in the specific regions of the wafer that can reduce wafer bowing. Additionally, by forming a set of back-side trenches before the wafer is in a processed state, embodiments of the present disclosure can proactively address predicted wafer bowing. Such a proactive approach can prevent wafer bowing during subsequent front-side processing operations performed on the wafer. As a result, embodiments of the present disclosure can reduce die defects.

In some embodiments, based on the characteristic data for the wafer, and in view of thermal considerations, the wafer modification system can select one or more regions of the wafer to modify with back-side trenches. For example, in some embodiments, such regions can include regions where a temperature, such as an operating temperature of a die of the wafer, is predicted to exceed a temperature threshold. In some embodiments, such regions can be selected to improve thermal variability on a given die by locally improving heat transfer. In some embodiments, such regions can be selected to increase thermal isolation between portions of a given die to result in improved thermal characteristics of sensitive chip regions. Accordingly, embodiments of the present disclosure can improve the operating performance of one or more dies of the wafer in view of thermal considerations.

Figure 1:
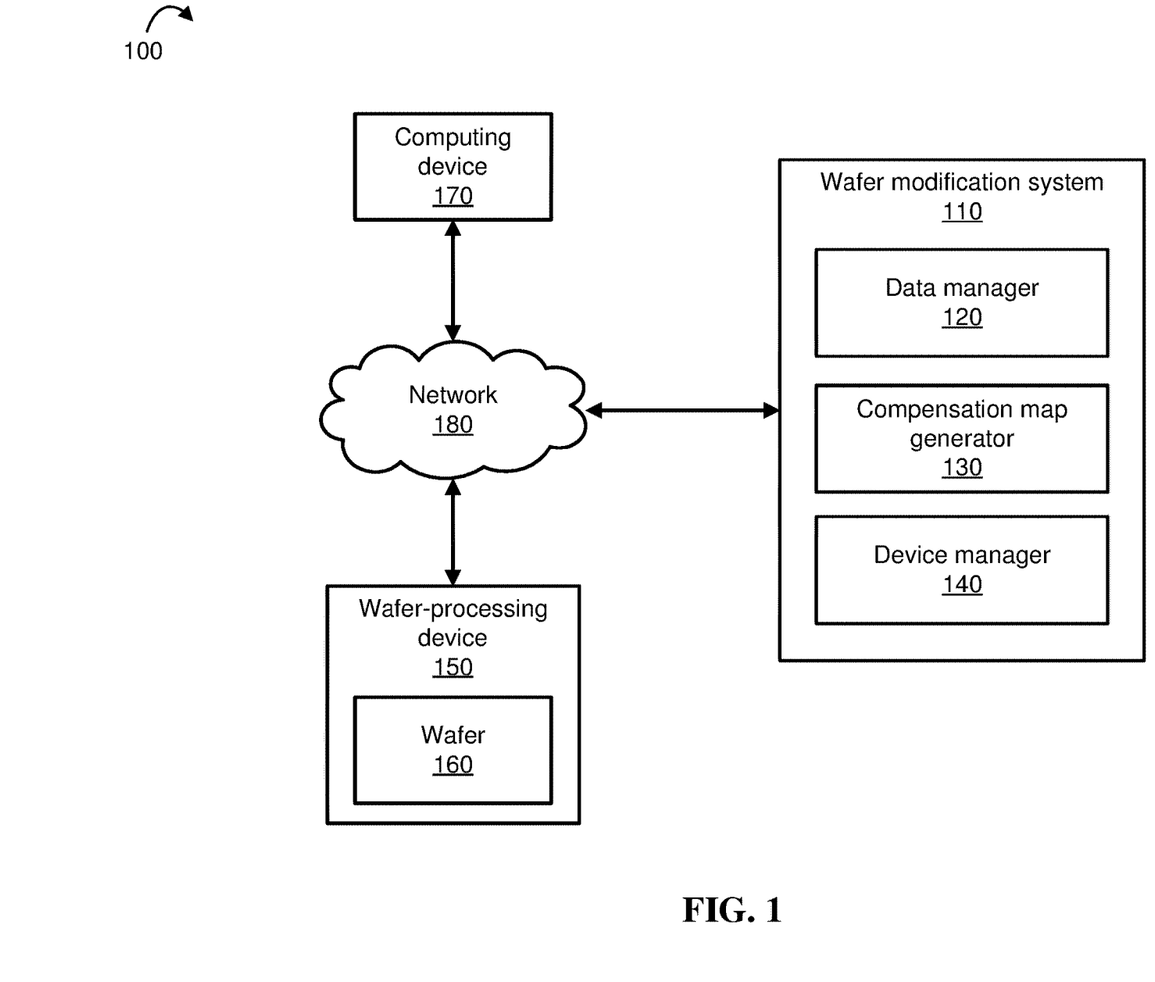
FIG. 1 depicts an example computing environment having a wafer modification system, in accordance with embodiments of the present disclosure.

Turning to the figures, FIG. 1 illustrates a computing environment 100 that includes one or more of each of a wafer modification system 110, a wafer-processing device 150, a computing device 170 and/or a network 180. In some embodiments, at least one wafer modification system 110, wafer-processing device 150, and/or computing device 170 can exchange data with at least one other through the at least one network 180. One or more of each of the wafer modification system 110, wafer-processing device 150, computing device 170, and/or network 180 can include a computer system, such as the computer system 401 discussed with respect to FIG. 4.

In some embodiments, the wafer modification system 110 can be included in software installed on a computer system of at least one of the computing device 170 and/or wafer-processing device 150. For example, in some embodiments, the wafer modification system 110 can be included as a plug-in software component of software installed on the wafer-processing device 150. The wafer modification system 110 can include program instructions implemented by a processor, such as a processor of the wafer-processing device 150, to perform one or more operations discussed with respect to FIGS. 2-3I.

In some embodiments, the wafer modification system 110 can include one or more modules, such as a data manager 120, a compensation map generator 130, and/or a device manager 140. In some embodiments, the data manager 120, compensation map generator 130, and/or device manager 140 can be integrated into a single module. In some embodiments, the data manager 120 can obtain, interpret, analyze, store, and/or initiate storage of data, such as characteristic data of a wafer. In some embodiments, the compensation map generator 130 can interpret and/or analyze data, such as characteristic data, and generate one or more compensation maps. In some embodiments, the wafer modification system 110 can include software for performing structural analysis and/or thermal analysis of characteristic data of a wafer. In some embodiments, the device manager 140 can transmit one or more commands to the one or more wafer-processing devices 150. For example, in some embodiments, the device manager 120 can transmit a command to an etching device to form a set of back-side trenches on a wafer 160, based on a compensation map. In some embodiments, one or more of the data manager 120, compensation map generator 130, and/or device manager 140 can include program instructions implemented by a processor, such as a processor of the wafer-processing device 150, to perform one or more operations discussed with respect to FIGS. 2-3I. For example, in some embodiments, the data manager 120 can include program instructions to perform operations 210 and 220, FIG. 2. In some embodiments, the compensation map generator 130 can include program instructions to perform operations 230 and 240, FIG. 2. In some embodiments, the device manager 140 can include program instructions to perform operations 250 and 260, FIG. 2.

In some embodiments, the one or more wafer-processing devices 150 can include a set of machines and/or equipment configured to perform processes such as photolithography, etching, deposition, and the like, to form electronic circuits on the wafer 160. In some embodiments, the one or more wafer-processing devices 150 can be configured to form back-side trenches on the wafer 160 and/or introduce one or more materials into back-side trenches of the wafer 160, in response to one or more commands issued by the wafer modification system 110. In some embodiments, the wafer modification system 110 can initiate the introduction of such materials to provide predetermined structural support and/or heat transfer properties to the wafer 160. The wafer 160 can refer to a substrate upon which a set of electronic circuits can be formed. The wafer 160 can be composed of a semiconductor material, such as silicon. The wafer 160 can be separated into a set of dies, each die including at least one electronic circuit.

In some embodiments, the one or more computing devices 170 can include a computer or a server. For example, in some embodiments, the one or more computing devices 170 can include a computer of an entity, such as a fabrication facility, that operates a wafer-processing device 150. The one or more computing devices 170 can be configured to store and/or process data, such as characteristic data, for the wafer 160. In some embodiments, the one or more computing devices 170 can provide such characteristic data to the wafer modification system 110. In some embodiments, the network 180 can be a wide area network (WAN), a local area network (LAN), the internet, or an intranet.

Figure 2:
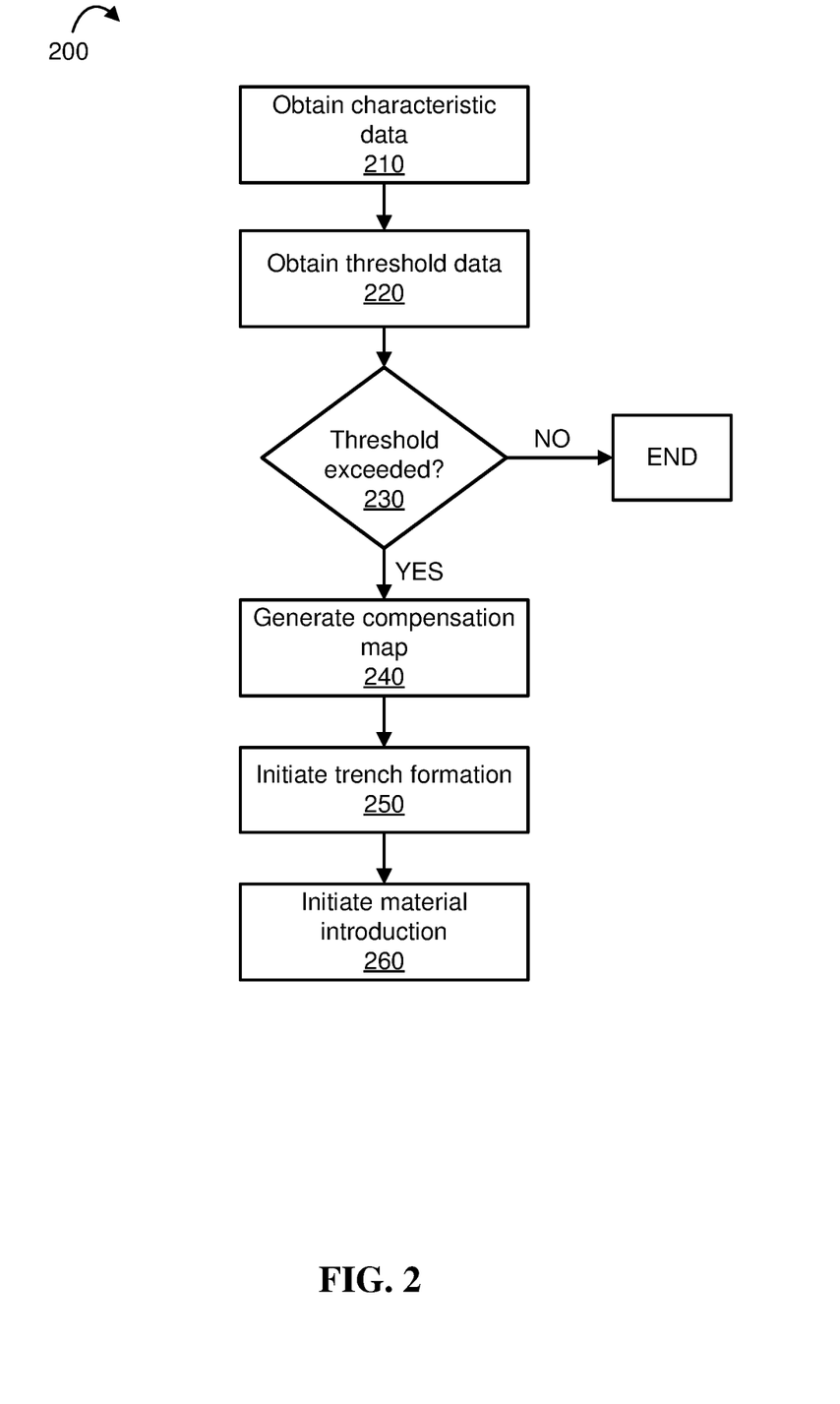
FIG. 2 depicts a flowchart of an example method for performing back-side wafer modification, in accordance with embodiments of the present disclosure.

FIG. 2 illustrates a flowchart of an example method 200 for performing back-side wafer modification, in accordance with embodiments of the present disclosure. Method 200 can be performed by a wafer modification system, such as the wafer modification system 110 discussed with respect to FIG. 1.

In operation 210, the wafer modification system can obtain characteristic data for a wafer. In some embodiments, characteristic data can include information regarding a wafer to be fabricated. For example, in some embodiments, characteristic data can include design data for a wafer, such as components (e.g., transistors) to be formed and their locations on the wafer; materials to be included in the wafer and their corresponding properties; features (e.g., front-side trenches) to be formed and their dimensions, locations on the wafer, and/or quantities; and the like. In some embodiments, characteristic data can include properties (e.g., stress values and/or temperature values) of the wafer in a processed state. A processed state can refer to a state of a wafer in which one or more front-side processes are completed on the front side of the wafer. For example, in some embodiments, a processed state can refer to a state in which front-end-of-line processes (e.g., deep-trench etching) and/or back-end-of-line processes (e.g., deposition of metallization layers) are completed on the wafer. In some embodiments, a processed state can refer to a state in which a wafer is separated into dies. In these embodiments, characteristic data can include one or more temperature values associated with a die component during the component's operation. For example, in some embodiments, characteristic data can include a predicted operating temperature of a diode formed on a die of a wafer.

In some embodiments, operation 210 can include the wafer modification system retrieving characteristic data from a source, such as a computing device (e.g., computing device 170, FIG. 1) and/or a wafer-processing device (e.g., wafer-processing device 150, FIG. 1). In some embodiments, operation 210 can include the wafer modification system generating characteristic data. For example, in some embodiments, the wafer modification system can employ structural analysis and/or thermal analysis tools to analyze design data for a wafer. Based on such analyses, the wafer modification system can calculate one or more stress values and/or temperature values corresponding to the wafer in a processed state. Further based on such analyses, the wafer modification system can determine the one or more regions of the wafer that can have such stress values and/or temperature values.

In operation 220, the wafer modification system can obtain threshold data. In some embodiments, the threshold data can include one or more parameter values that the wafer modification system can use to predict whether wafer bowing may occur. For example, in some embodiments, the threshold data can include a stress threshold value. In this example, a stress value of the wafer that exceeds the stress threshold value can indicate that wafer bowing in response to one or more front-side processing operations is likely to occur. Thus, in this example, the wafer modification system can predict that wafer bowing may occur in response to determining that a stress value of the wafer exceeds the stress threshold value. In some embodiments, the threshold data can include one or more parameter values that the wafer modification system can use to predict an operating characteristic of a component formed from a wafer. For example, in some embodiments, the threshold data can include a temperature threshold value for a set of transistors formed on a die of wafer. In this example, an operating temperature value for the set of transistors that exceeds the temperature threshold value can indicate an excessive operating temperature of the die. Thus, in this example, the wafer modification system can predict a deficient operation of the die in response to determining that an operating temperature value exceeds the temperature threshold value.

In some embodiments, the threshold data can be predetermined by an entity, such as a programmer or an operator of the wafer modification system. In some embodiments, the wafer modification system can obtain the threshold data from a source, such as a web server of a third-party company, that stores data regarding prior structural and/or thermal analyses of wafers and/or components of wafers.

In operation 230, the wafer modification system can determine, based on the characteristic data obtained in operation 210, whether a threshold obtained in operation 220 is exceeded. For example, in some embodiments, operation 230 can include the wafer modification system comparing a stress value obtained in operation 210 to a stress threshold obtained in operation 220 to determine whether the stress value exceeds the stress threshold. If the wafer modification system determines that the characteristic data exceeds the threshold data, then the wafer modification system can proceed to operation 240. Otherwise, if the wafer modification system determines that the characteristic data does not exceed the threshold data, then method 200 can end.

In operation 240, the wafer modification system can generate a compensation map. A compensation map can include a set of specifications for forming one or more back-side trenches on a wafer. In some embodiments, the set of specifications can include information such as dimensions, quantities, and/or formation locations (e.g., regions of the wafer where back-side trenches are to be formed) for the one or more back-side trenches. In some embodiments, the compensation map can include a visual representation of a wafer (e.g., a computer model and/or a set of images of a wafer). In these embodiments, such a visual representation can be displayed on a screen of a computing device and/or processing device. The visual representation can facilitate a user's ability to view features of the wafer and interpret the set of specifications for forming one or more back-side trenches on a wafer.

In some embodiments, the wafer modification system can generate the compensation map based, at least in part, on the characteristic data obtained in operation 210. For example, in some embodiments, the characteristic data can include a set of stress values corresponding to a respective set of regions of the wafer in a processed state. In this example, the wafer modification system can predict, in response to performing operation 230, that wafer bowing is likely to occur in each region of the set of regions. In response, the wafer modification system can generate, for each region, specifications for forming one or more back-side trenches that can reduce the stress in the wafer. By reducing such stress, the wafer modification system can reduce a degree of bowing in each region. In this example, the wafer modification system can generate the specifications by employing structural analysis tools to analyze design data and/or properties of the wafer in a processed state. Through such analysis, the wafer modification system can determine specifications that can reduce wafer bowing.

In some embodiments, operation 240 can include the wafer modification system accounting for additional structural and/or thermal effects of forming back-side trenches on a wafer. For example, in some embodiments, the wafer modification system can generate a set of specifications for forming one or more back-side trenches in which a structural support region is disposed between the one or more back-side trenches and one or more front-side processing features (e.g., front-side trenches) of the wafer. In these embodiments, the wafer modification system can specify dimensions of the structural support region such that a threshold stiffness or a threshold flexibility can be maintained in the wafer. Such a threshold stiffness or flexibility can allow the wafer and/or dies of the wafer to endure forces that could otherwise cause physical damage to the wafer and/or dies of the wafer.

In some embodiments, operation 240 can include the wafer modification system selecting a material to be introduced into one or more back-side trenches. Such an introduction of a material can allow the wafer modification system to further adjust the structural and/or thermal properties of the wafer. In some embodiments, the introduction of a material can also prevent undesired materials from accumulating inside the back-side trenches. In some embodiments, the wafer modification system can select the material based, at least in part, on one or more stress values and/or one or more temperature values included in the characteristic data obtained in operation 210. For example, in some embodiments, the wafer modification system can select a material that, when introduced into one or more back-side trenches, can reduce a stress value of the wafer while improving heat transfer properties of the wafer and/or dies of the wafer. In some embodiments, the wafer modification system can select a material such as gold, lead, an aerogel, or carbon to modify wafer stress and/or stiffness. In some embodiments, the wafer modification system can select a material such as copper or aluminum to increase thermal conductivity, and the wafer modification system can select an insulating material, such as a gas, an oil, or an aerogel, to reduce thermal conductivity.

In operation 250, the wafer modification system can initiate a formation of one or more back-side trenches based on the compensation map generated in operation 240. In some embodiments, operation 250 can include the wafer modification system issuing one or more commands to one or more processing devices (e.g., processing devices 150, FIG. 1) to form the one or more back-side trenches. In some embodiments, such commands can include instructions to form the one or more back-side trenches before the wafer is in a processed state (e.g., before one or more front-side processes are completed on the front side of the wafer). For example, in some embodiments, such commands can include instructions for a processing device to form a set of back-side trenches before the processing device performs deep-trench etching on the front side of the wafer. In this way, the wafer modification system can proactively compensate for stresses induced by front-side processes that are predicted to cause wafer bowing. In some embodiments, such commands can include instructions for a processing device to form a set of back-side trenches after the wafer is in a processed state. In these embodiments, the wafer modification system can form the set of back-side trenches to modify a predicted operating temperature of a component formed from the wafer and/or to reduce stresses that can occur after front-side processing (e.g., stresses due to thermal expansion and/or packaging of a die).

In operation 260, the wafer modification system can initiate an introduction of a material into one or more of the back-side trenches formed in operation 250. Such introduction of a material can be based on the compensation map generated in operation 240. In some embodiments, operation 260 can include the wafer modification system issuing one or more commands to one or more processing devices (e.g., processing devices 150, FIG. 1) to insert a material into one or more back-side trenches. In some embodiments, the one or more processing devices can introduce the material into one or more of the back-side trenches through a deposition process. In some embodiments, such commands can include instructions to insert the material before the wafer is in a processed state. In this way, the wafer modification system can proactively compensate for stresses and/or temperature gradients induced by front-side processes. In some embodiments, such commands can include instructions to insert the material after the wafer is in a processed state. In these embodiments, the wafer modification system can adjust the set of back-side trenches to modify a predicted operating temperature of a component formed from the wafer and/or to reduce stresses that can occur after front-side processing.

FIGS. 3A-3I depict wafers in accordance with embodiments of the present disclosure. The figures are not shown to scale; features included in these figures are shown enlarged for clarity. Furthermore, numbers of features/regions, shapes of features/regions, positions of features/regions, and relationships between features/regions (e.g., relative position, relative size, etc.) are shown for illustrative purposes and are not to be construed as limiting.

Figure 3A:
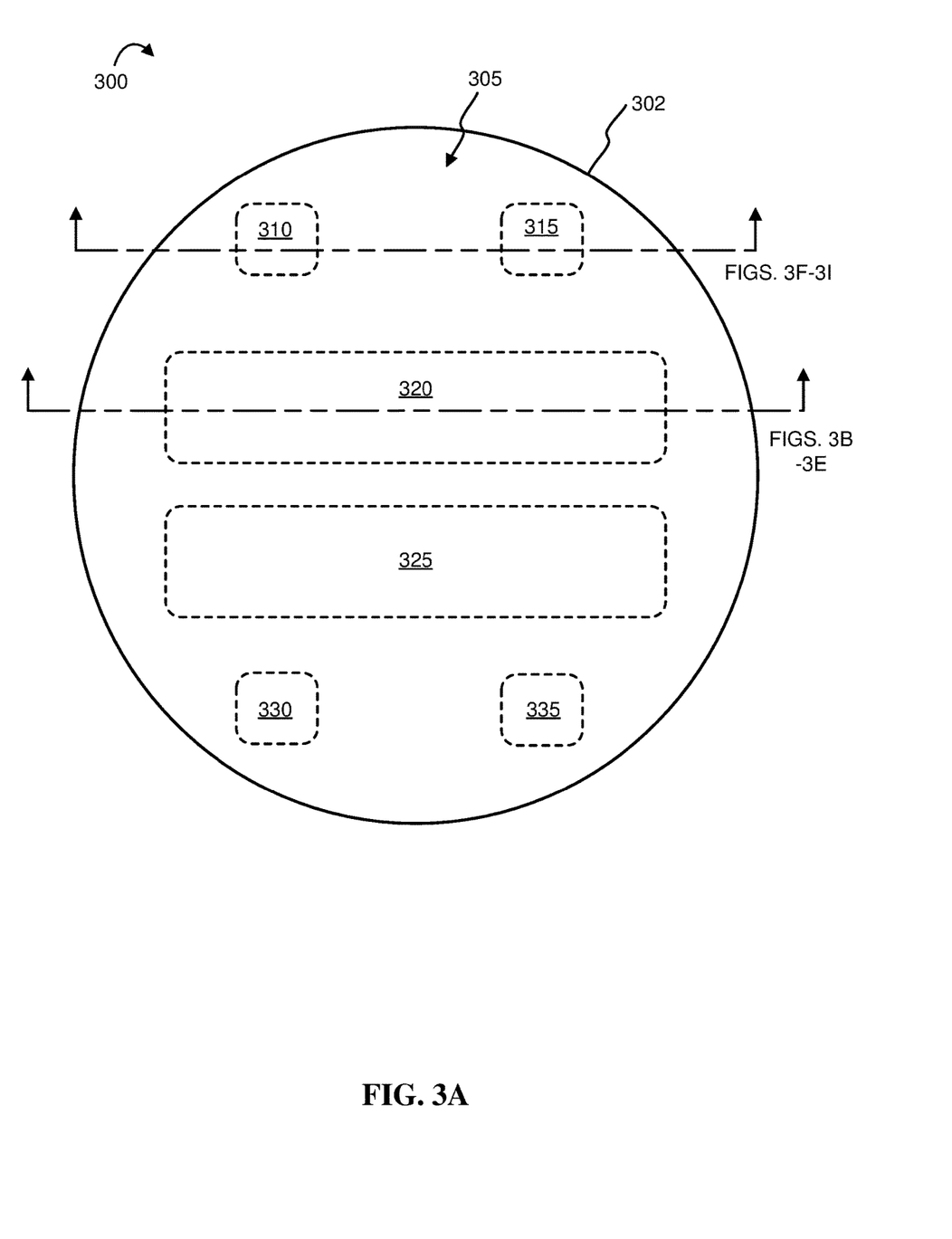
FIG. 3A depicts a top view representation of a wafer included in a compensation map, in accordance with embodiments of the present disclosure.

FIG. 3A depicts a top view representation 300 of a wafer 302 included in a compensation map, in accordance with embodiments of the present disclosure. The wafer 302 has a front side 305 opposite a back side (not shown). The representation 300 indicates regions 320, 325 of the wafer 302 where the wafer modification system can initiate the formation of back-side trenches to compensate for stresses induced by front-side processing operations on the wafer 302. The representation 300 further indicates regions 310, 315, 330, 335 of the wafer 302 where the wafer modification system can initiate the formation of back-side trenches to modify thermal properties (e.g., an operating temperature) of dies of the wafer 302.

Figure 3B:
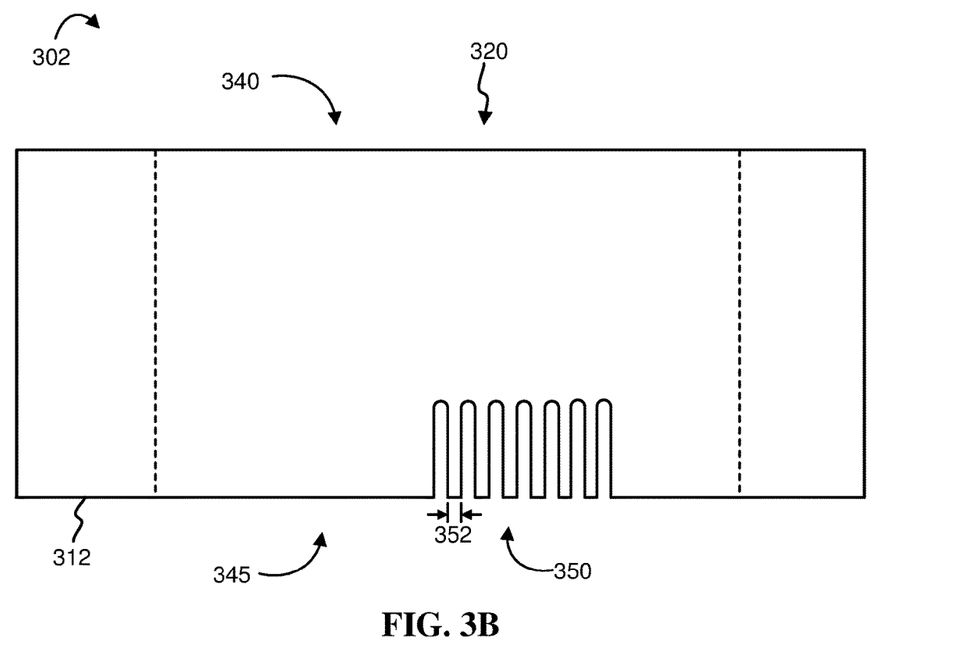
FIG. 3B depicts a section view of the wafer depicted in FIG. 3A before the wafer is in a processed state; the wafer having back-side trenches, in accordance with embodiments of the present disclosure.

FIG. 3B depicts a section view of the wafer 302 depicted in FIG. 3A before the wafer 302 is in a processed state (e.g., before one or more front-side processes are completed on the front side 340 of the wafer 302). On the back side 345 of the wafer 302, and within the region 320, a set of back-side trenches 350 are formed, in accordance with embodiments of the present disclosure. The set of back-side trenches 350 includes a plurality of trenches that are substantially parallel to one another. A space 352 horizontally separates each of the plurality of trenches from another. In some embodiments, such spaces 352 have substantially equal widths. Additionally, the set of back-side trenches 350 extends substantially perpendicularly from the back-side surface 312 of the back side 345 toward the front side 340 of the wafer 302.

Figure 3C:
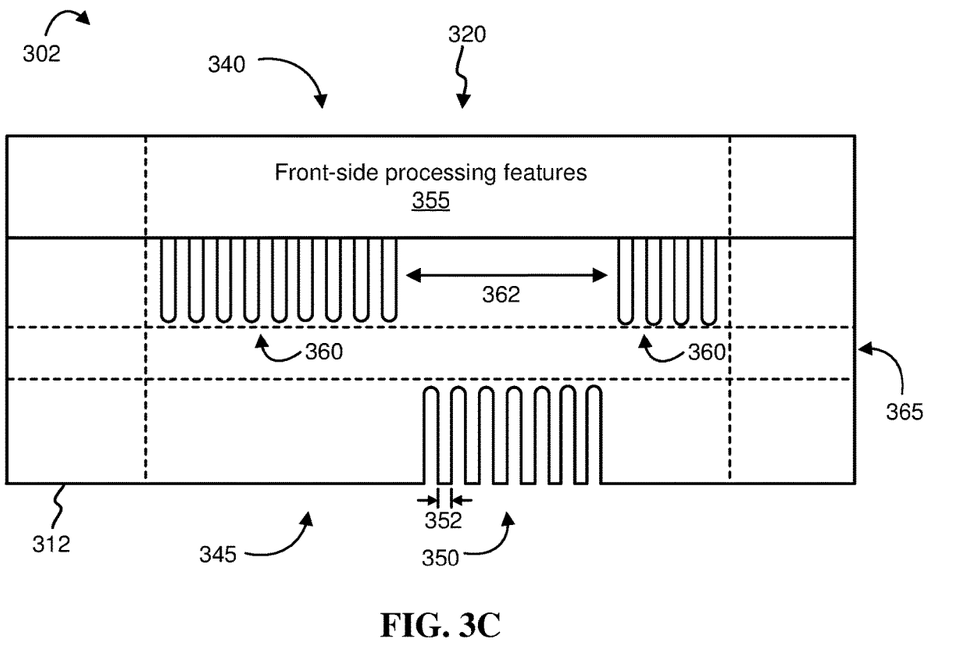
FIG. 3C depicts the wafer of FIG. 3B in a processed state, in accordance with embodiments of the present disclosure.

FIG. 3C depicts the wafer 302 of FIG. 3B in a processed state, in accordance with embodiments of the present disclosure. In FIG. 3C, front-side processing features 355, including sets of deep trenches 360, are formed on the front side 340 of the wafer 302. In some embodiments, the front-side processing features 355 can include features such as conductive traces, metallization layers, and transistors. The front-side processing features 355, including the sets of deep trenches 360, can form one or more electronic circuits on the front side 340 of the wafer 302. FIG. 3C depicts the front-side processing features 355, including the sets of deep trenches 360, formed after the set of back-side trenches 350 is formed. The wafer 302 additionally includes a structural support region 365 disposed between the sets of deep trenches 360 and the set of back-side trenches 350. More specifically, the structural support region 365 is disposed beneath the sets of deep trenches 360 and above both the back-side surface 312 and the set of back-side trenches 350. No trenches extend into the structural support region 365. The wafer 302 also includes a gap 362 between the sets of deep trenches 360. No deep trenches are present in the gap 362. FIG. 3C depicts the set of back-side trenches 350 disposed beneath the gap 362. In some embodiments, such a configuration can reduce predicted bowing of the wafer 302.

Figure 3D:
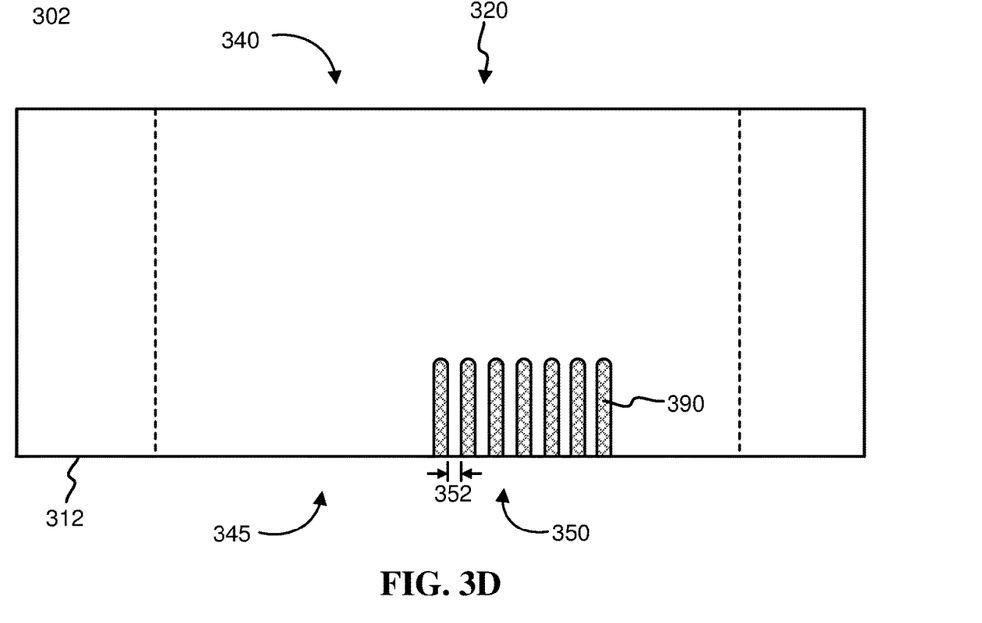
FIG. 3D depicts the wafer of FIG. 3B having a material introduced into the back-side trenches, in accordance with embodiments of the present disclosure.

FIG. 3D depicts the wafer 302 of FIG. 3B having a material 390 introduced into the set of back-side trenches 350, in accordance with embodiments of the present disclosure. In some embodiments, the material 390 can substantially fill the set of back-side trenches 350 (e.g., the material 390 can fill at least approximately 90 percent of the volume of each of the back-side trenches). In some embodiments, the material 390 can include gold, lead, an aerogel, or carbon.

Figure 3E:
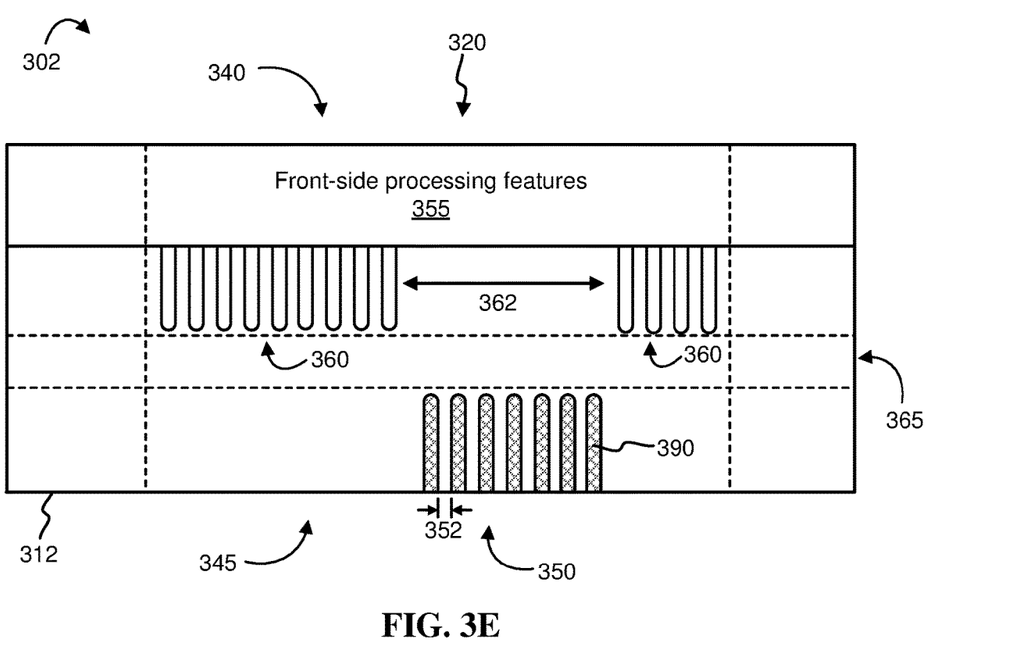
FIG. 3E depicts the wafer of FIG. 3D in a processed state, in accordance with embodiments of the present disclosure.

FIG. 3E depicts the wafer 302 of FIG. 3D in a processed state, in accordance with embodiments of the present disclosure. FIG. 3E depicts the front-side processing features 355, including the sets of deep trenches 360, formed after the material 390 is introduced into the set of back-side trenches 350.

Figure 3F:
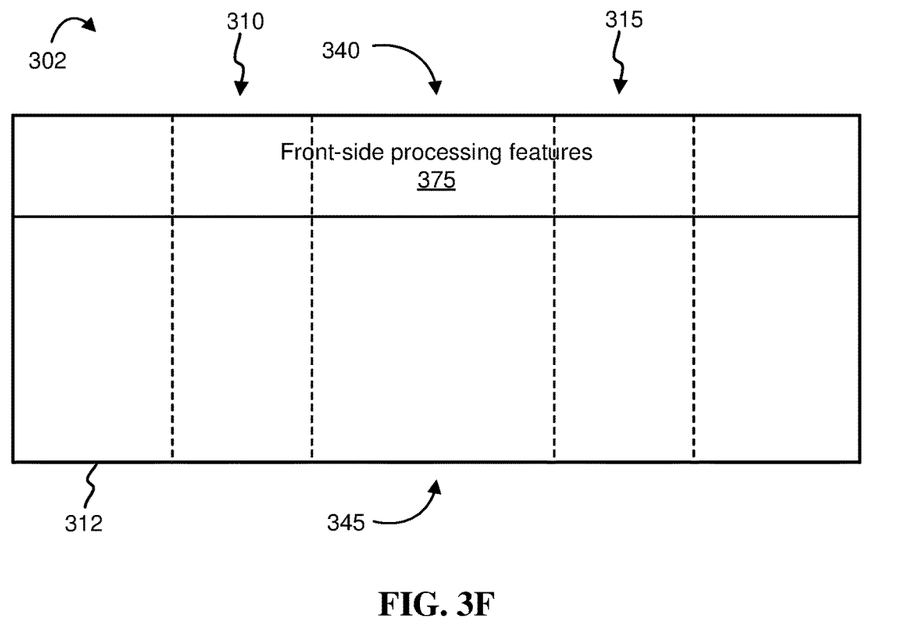
FIG. 3F depicts a section view of the wafer depicted in FIG. 3A in a processed state, in accordance with embodiments of the present disclosure.

FIG. 3F depicts a section view of the wafer 302 depicted in FIG. 3A in a processed state, in accordance with embodiments of the present disclosure. Accordingly, front-side processing features 375 (e.g., conductive traces, metallization layers, transistors, etc.) are formed on the front side 340 of the wafer 302. The front-side processing features 375 can form one or more electronic circuits on the front side 340 of the wafer 302. Regions 310, 315 represent areas where the wafer modification system can initiate the formation of back-side trenches on the back side 345 of the wafer, in accordance with embodiments of the present disclosure.

Figure 3G:
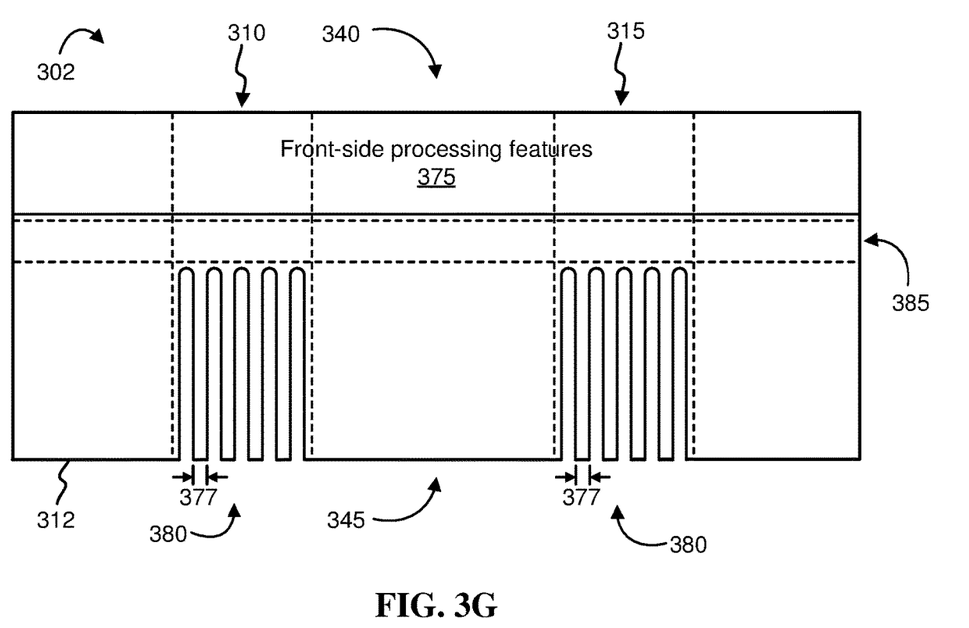
FIG. 3G depicts the wafer of FIG. 3F having back-side trenches, in accordance with embodiments of the present disclosure.

FIG. 3G depicts the wafer 302 of FIG. 3F having sets of back-side trenches 380, in accordance with embodiments of the present disclosure. The sets of back-side trenches 380 are formed on the back side 345 of the wafer 302 within the regions 310, 315. FIG. 3G depicts the sets of back-side trenches 380 formed after the front-side processing features 375 are formed on the front side 340 of the wafer 302. The sets of back-side trenches 380 include a plurality of trenches that are substantially parallel to one another. A space 377 horizontally separates each of the plurality of trenches from another. In some embodiments, such spaces 377 have substantially equal widths. Additionally, the sets of back-side trenches 380 extend substantially perpendicularly from the back-side surface 312 of the back side 345 toward the front side 340 of the wafer 302. The wafer 302 additionally includes a structural support region 385 disposed between the front-side processing features 375 and the sets of back-side trenches 380. More specifically, the structural support region 385 is disposed beneath the front-side processing features 375 and above both the back-side surface 312 and the sets of back-side trenches 380.

Figure 3H:
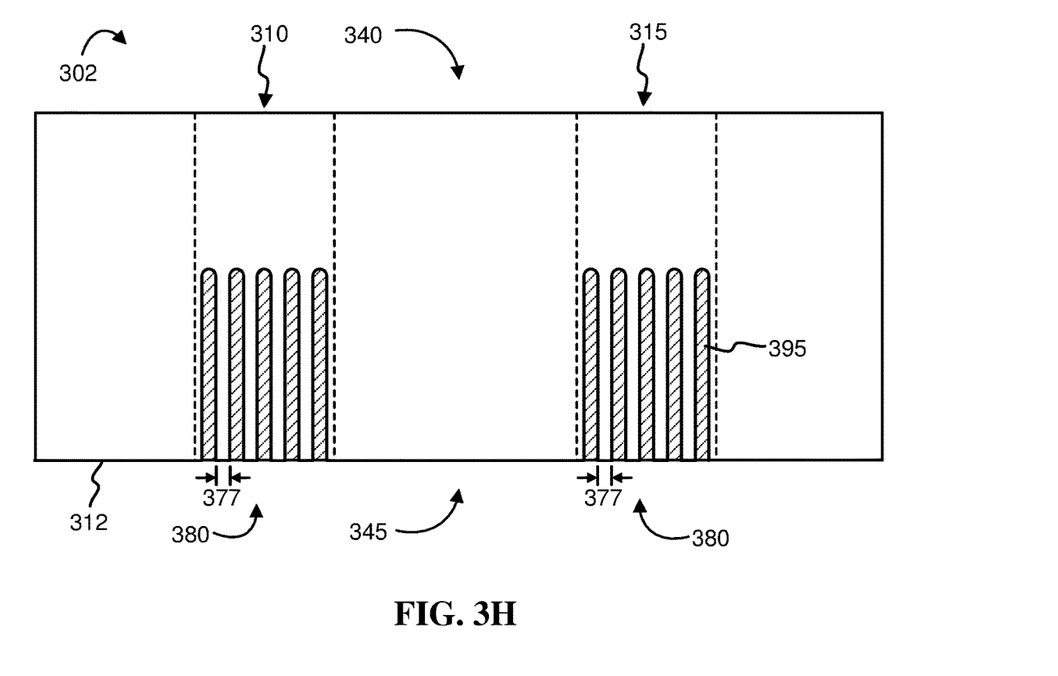
FIG. 3H depicts a section view of the wafer depicted in FIG. 3A before the wafer is in a processed state; the wafer having a material introduced into back-side trenches, in accordance with embodiments of the present disclosure.

FIG. 3H depicts a section view of the wafer 302 depicted in FIG. 3A before the wafer 302 is in a processed state. On the back side 345 of the wafer 302 and within the regions 310, 315, sets of back-side trenches 380 are formed. A material 395 is introduced into the sets of back-side trenches 380, in accordance with embodiments of the present disclosure. In some embodiments, the material 395 can substantially fill the sets of back-side trenches 380 (e.g., the material 395 can fill at least approximately 90 percent of the volume of each of the back-side trenches). In some embodiments, the material 395 can include copper, aluminum, a gas, an oil, or an aerogel.

Figure 3I:
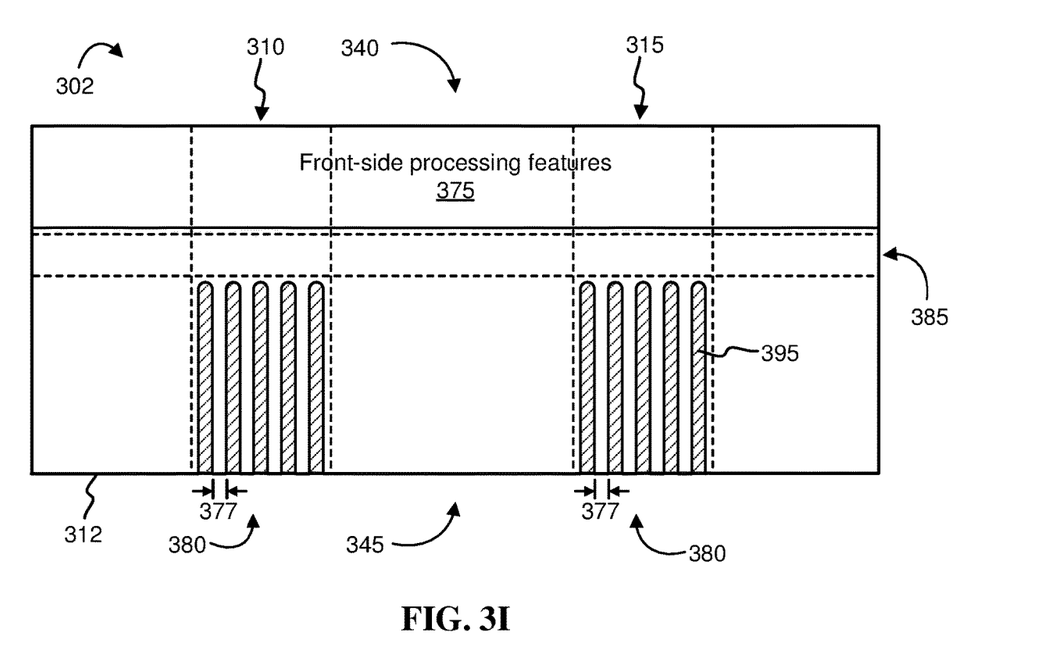
FIG. 3I depicts the wafer of FIG. 3H in a processed state, in accordance with embodiments of the present disclosure.

FIG. 3I depicts the wafer of FIG. 3H in a processed state, in accordance with embodiments of the present disclosure. FIG. 3I depicts the front-side processing features 375 formed after the material 395 is introduced into the sets of back-side trenches 380. The wafer 302 additionally includes a structural support region 385 disposed between the front-side processing features 375 and the sets of back-side trenches 380.

Figure 4:
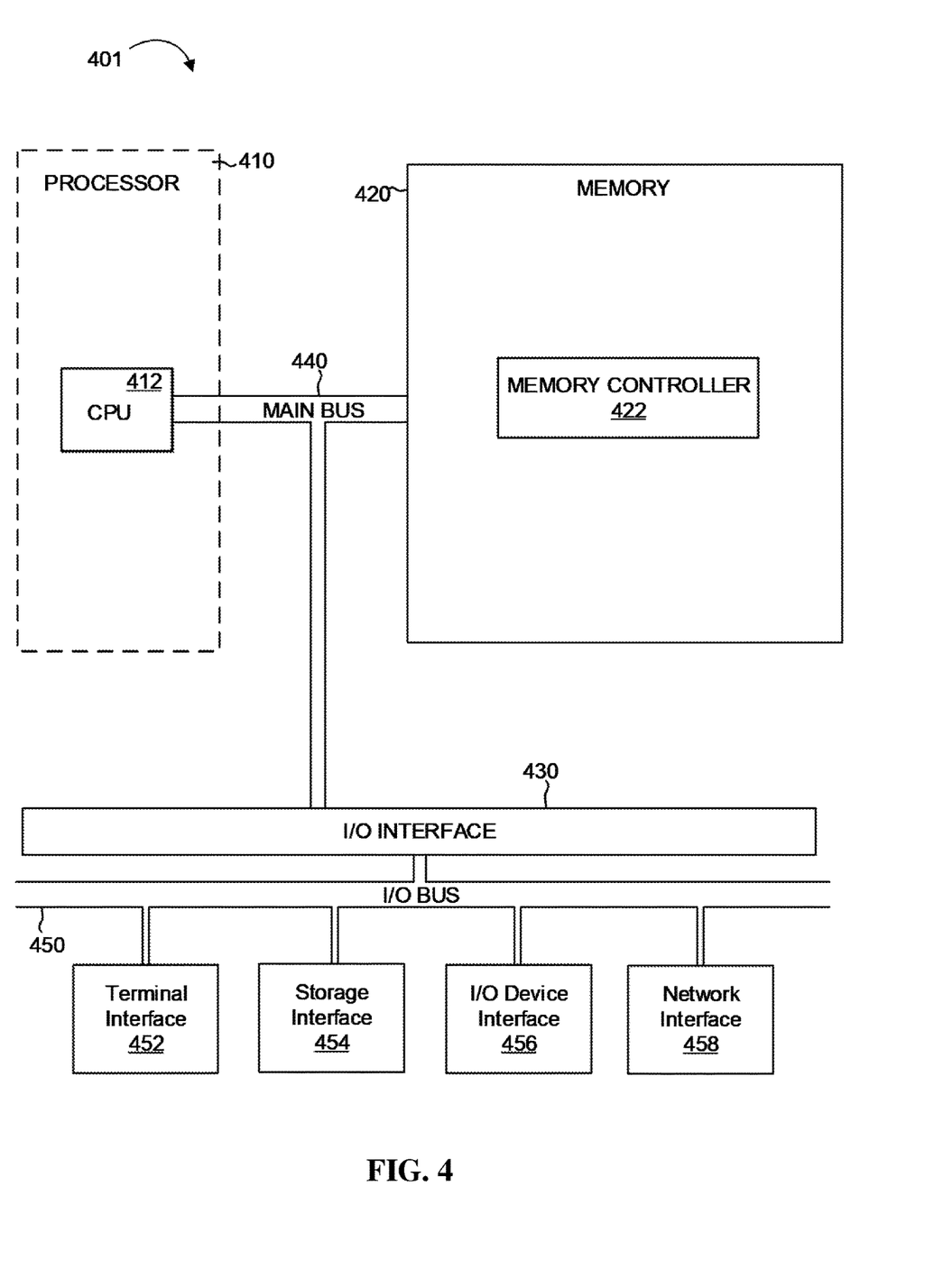
FIG. 4 depicts the representative major components of a computer system that can be used in accordance with embodiments of the present disclosure.

FIG. 4 depicts the representative major components of an exemplary Computer System 401 that can be used in accordance with embodiments of the present disclosure. The particular components depicted are presented for the purpose of example only and are not necessarily the only such variations. The Computer System 401 can comprise a Processor 410, Memory 420, an Input/Output Interface (also referred to herein as I/O or I/O Interface) 430, and a Main Bus 440. The Main Bus 440 can provide communication pathways for the other components of the Computer System 401. In some embodiments, the Main Bus 440 can connect to other components such as a specialized digital signal processor (not depicted).

The Processor 410 of the Computer System 401 can be comprised of one or more CPUs 412. The Processor 410 can additionally be comprised of one or more memory buffers or caches (not depicted) that provide temporary storage of instructions and data for the CPU 412. The CPU 412 can perform instructions on input provided from the caches or from the Memory 420 and output the result to caches or the Memory 420. The CPU 412 can be comprised of one or more circuits configured to perform one or methods consistent with embodiments of the present disclosure. In some embodiments, the Computer System 401 can contain multiple Processors 410 typical of a relatively large system. In other embodiments, however, the Computer System 401 can be a single processor with a singular CPU 412.

The Memory 420 of the Computer System 401 can be comprised of a Memory Controller 422 and one or more memory modules for temporarily or permanently storing data (not depicted). In some embodiments, the Memory 420 can comprise a random-access semiconductor memory, storage device, or storage medium (either volatile or non-volatile) for storing data and programs. The Memory Controller 422 can communicate with the Processor 410, facilitating storage and retrieval of information in the memory modules. The Memory Controller 422 can communicate with the I/O Interface 430, facilitating storage and retrieval of input or output in the memory modules. In some embodiments, the memory modules can be dual in-line memory modules.

The I/O Interface 430 can comprise an I/O Bus 450, a Terminal Interface 452, a Storage Interface 454, an I/O Device Interface 456, and a Network Interface 458. The I/O Interface 430 can connect the Main Bus 440 to the I/O Bus 450. The I/O Interface 430 can direct instructions and data from the Processor 410 and Memory 420 to the various interfaces of the I/O Bus 450. The I/O Interface 430 can also direct instructions and data from the various interfaces of the I/O Bus 450 to the Processor 410 and Memory 420. The various interfaces can comprise the Terminal Interface 452, the Storage Interface 454, the I/O Device Interface 456, and the Network Interface 458. In some embodiments, the various interfaces can comprise a subset of the aforementioned interfaces (e.g., an embedded computer system in an industrial application may not include the Terminal Interface 452 and the Storage Interface 454).

Logic modules throughout the Computer System 401—including but not limited to the Memory 420, the Processor 410, and the I/O Interface 430—can communicate failures and changes to one or more components to a hypervisor or operating system (not depicted). The hypervisor or the operating system can allocate the various resources available in the Computer System 401 and track the location of data in Memory 420 and of processes assigned to various CPUs 412. In embodiments that combine or rearrange elements, aspects of the logic modules' capabilities can be combined or redistributed. These variations would be apparent to one skilled in the art.

As discussed in more detail herein, it is contemplated that some or all of the operations of some of the embodiments of methods described herein can be performed in alternative orders or may not be performed at all; furthermore, multiple operations can occur at the same time or as an internal part of a larger process.

The present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A device comprising:
    a wafer having a front side and a back side, the front side configured to receive front-side processing features that form one or more electronic circuits including a set of deep trenches, the back side opposite to the front side; the back side comprising a back-side surface and a first set of trenches, the first set of trenches comprising a first trench and a second trench in a region of the wafer selected based on a potential for bowing of the wafer in the region,
    wherein the region of the wafer is selected by: obtaining characteristic data for the region of the wafer that includes stress values of the region of the wafer, comparing the characteristic data to a threshold corresponding to the potential for bowing in the region of the wafer, and
    selecting the region of the wafer based on the characteristic data exceeding the threshold,
    wherein the first trench is substantially parallel to the second trench, and
    wherein the first trench and the second trench extend substantially perpendicularly from the back-side surface toward the front side and beneath the set of deep trenches to compensate the bowing of the wafer in the region.

2. The device of claim 1, wherein the first trench and the second trench include a material that substantially fills the first trench and the second trench, the material selected from the group consisting of gold, lead, an aerogel, or carbon.

3. The device of claim 1, wherein the back side further comprises a second set of trenches, the second set of trenches comprising a third trench and a fourth trench,
    wherein the third trench is substantially parallel to the fourth trench,
    wherein the third trench and the fourth trench extend substantially perpendicularly from the back-side surface toward the front side,
    wherein the third trench and the fourth trench include a material that substantially fills the third trench and the fourth trench, and
    wherein neither the first trench nor the second trench includes the material.

4. The device of claim 3, wherein the material is selected from the group consisting of copper and aluminum.

5. The device of claim 1, wherein the set of deep trenches include a first set of deep trenches and a second set of deep trenches.

6. The device of claim 5, wherein a gap is disposed between the first set of deep trenches and the second set of deep trenches,
    wherein no deep trenches are present in the gap, and
    wherein the first set of trenches is disposed beneath the gap and between the first set of deep trenches and the second set of deep trenches.

7. The device of claim 5, wherein a structural support region is disposed beneath the first set of deep trenches and the second set of deep trenches,
    wherein the structural support region is disposed above the back-side surface, and
    wherein neither the first set of deep trenches, the second set of deep trenches, nor the first set of trenches extends into the structural support region.

8. The device of claim 1, wherein the first set of trenches further comprises a third trench,
    wherein the third trench is substantially parallel to the second trench,
    wherein the third trench extends substantially perpendicularly from the back-side surface toward the front side,
    wherein a first space having a first width horizontally separates the first trench from the second trench,
    wherein a second space having a second width horizontally separates the second trench from the third trench, and wherein the first width and the second width are substantially equal.

9. A device comprising:

a wafer having a front side and a back side opposite to the front side, wherein the front side comprises front-side processing features that form one or more electronic circuits, the front-side processing features including a first set of deep trenches and a second set of deep trenches, wherein a gap is disposed between the first set of deep trenches and the second set of deep trenches, wherein no deep trenches are present in the gap;

the back side comprising a back-side surface and a first set of trenches, the first set of trenches comprising a first trench and a second trench in a region of the wafer selected based on a potential for bowing of the wafer in the region, wherein the region of the wafer is selected by: obtaining characteristic data for the region of the wafer that includes stress values of the region of the wafer, comparing the characteristic data to a threshold corresponding to the potential for bowing in the region of the wafer, and selecting the region of the wafer based on the characteristic data exceeding the threshold, wherein the first trench is substantially parallel to the second trench, wherein the first trench and the second trench extend substantially perpendicularly from the back-side surface toward the front side, and wherein the first set of trenches is disposed beneath the gap and between the first set of deep trenches and the second set of deep trenches to compensate the bowing of the wafer in the region.

10. The device of claim 9, wherein the first trench and the second trench include a material that substantially fills the first trench and the second trench, the material selected from the group consisting of gold, lead, carbon, and an aerogel.

* * * * *